United States Patent
Noda et al.

(10) Patent No.: US 8,815,010 B2
(45) Date of Patent: Aug. 26, 2014

(54) INP SINGLE CRYSTAL WAFER AND METHOD FOR PRODUCING INP SINGLE CRYSTAL

(75) Inventors: Akira Noda, Kitaibaraki (JP); Ryuichi Hirano, Kitaibaraki (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 890 days.

(21) Appl. No.: 11/587,698

(22) PCT Filed: Feb. 15, 2005

(86) PCT No.: PCT/JP2005/002223
§ 371 (c)(1),
(2), (4) Date: Oct. 26, 2006

(87) PCT Pub. No.: WO2005/106083
PCT Pub. Date: Nov. 10, 2005

(65) Prior Publication Data
US 2008/0019896 A1    Jan. 24, 2008

(30) Foreign Application Priority Data
Apr. 28, 2004    (JP) .................................. 2004-132661

(51) Int. Cl.
| C01B 25/08 | (2006.01) |
| C30B 15/10 | (2006.01) |
| C30B 27/02 | (2006.01) |
| C01B 25/00 | (2006.01) |
| C30B 15/00 | (2006.01) |

(52) U.S. Cl.
USPC .............................. 117/13; 117/953; 423/299

(58) Field of Classification Search
USPC .................. 423/299; 257/615, 267, E21.101, 257/E21.109, E21.119, E21.214, E29.089; 117/13, 17, 18, 19, 953; 438/478, 483; 428/402, 688, 704
See application file for complete search history.

(56) References Cited

U.S. PATENT DOCUMENTS 4,483,736 A * 11/1984 Orito ................................ 117/46
4,863,554 A *  9/1989 Kawasaki et al. ................. 117/3
(Continued)

FOREIGN PATENT DOCUMENTS

| EP | 0 416 128 A1 |   | 3/1991 |
| JP | 01-096093 | * | 4/1989 |
(Continued)

OTHER PUBLICATIONS

Kohiro et al., "Growth of long-length 3 inch diameter Fe-doped InP single crystals," 1996, Journal of Crystal Growth, 158, pp. 197-204.*
JP 05-070276 English Translation from PAJ, Kawase, 1993.*
Hirano et al., Jpn. J. Appl. Phys. vol. 41 (2002) pp. 987 to 990.
A. Noda et al., Proc. of 14th intern. Conf. on Indium Phosphide and Related Materials pp. 397 to 400.
(Continued)

*Primary Examiner* — Melvin C Mayes
*Assistant Examiner* — Colin W Slifka
(74) *Attorney, Agent, or Firm* — Birch, Stewart, Kolasch & Birch, LLP

(57) ABSTRACT

A method for producing a low-dislocation InP single crystal suitably used for an optical device such as a semiconductor laser, and the low-dislocation InP single crystal wafer are provided. In a liquid-encapsulated Czochralski method in which a semiconductor raw material and an encapsulant are contained in a raw material melt containing part comprising a cylindrical crucible having a bottom, the raw material containing part is heated to melt the raw material, and a seed crystal is brought into contact with a surface of a melt of the raw material in a state of being covered with the encapsulant to grow a crystal while the seed crystal is raised; a crystal shoulder part is grown from the seed crystal by setting a temperature gradient in a crystal growth direction to 25° C./cm or less and setting a temperature-fall amount to 0.25° C./hr or more. Thus, an iron-doped or undoped InP single crystal wafer in which an area having a dislocation density of 500/cm$^2$ or less occupies 70% or more is realized.

9 Claims, 5 Drawing Sheets

(56) References Cited

U.S. PATENT DOCUMENTS

| | | | |
|---|---|---|---|
| 5,212,394 A | * | 5/1993 | Iwasaki et al. ............... 428/66.7 |
| 5,292,487 A | * | 3/1994 | Tatsumi et al. ............... 117/201 |
| 5,342,475 A | * | 8/1994 | Yoshida et al. ................ 117/83 |
| 5,379,717 A | | 1/1995 | Yoshida et al. |

FOREIGN PATENT DOCUMENTS

| | | | |
|---|---|---|---|
| JP | 3-65593 A | | 3/1991 |
| JP | 3-237088 A | | 10/1991 |
| JP | 4-160099 A | | 6/1992 |
| JP | 5-70276 A | | 3/1993 |
| JP | 8-104591 A | | 4/1996 |
| JP | H08104591 A | * | 4/1996 |
| JP | 9-278582 A | | 10/1997 |
| JP | 11-302094 A | | 11/1999 |
| JP | 2005-200228 | * | 7/2005 |
| WO | WO-03/060202 A1 | | 7/2003 |

OTHER PUBLICATIONS

I.R. Grant Proc. of 14th intern. Conf. on Indium Phosphide and Related Materials, pp. 413 to 415.

Akira Noda et al., "Growth of Dislocation Free grade Fe doped InP Crystals", $16^{th}$ IPRM 2004 International Conference on Kagoshima, Japan, May 31-Jun. 4, 2004, pp. 552-553, XP-010815043.

Xiaolong Zhou, et al., "Study on the perfection of in situ P-injection synthesis LEC-InP single crystals", Journal of Crystal Growth, vol. 264, Nos. 1-3, Mar. 15, 2004, pp. 17-20, XP-004493895.

Deborah A. Clark, "Evaluation of 4 InP(Fe) Substrates for Production of HBTS", Institute of Electrical and Electronics Engineers, GAAS IC Symposium, $23^{rd}$ Annual IEEE Gallium Arsenide Integrated Circuit Symposium, Technical Digest, Oct. 21-24, 2001, pp. 181-184, XP-001046984.

Japanese Office Action for Application No. 2006-512725 dated Feb. 8, 2011.

* cited by examiner

DISLOCATION DENSITY (cm$^{-2}$)
- 0
- 0~200
- 200~500
- 500~2000
- 2000~5000
- 5000~

DISLOCATION DENSITY (cm$^{-2}$)
- 0
- 0~200
- 200~500
- 500~2000
- 2000~5000
- 5000~

Intensity - Average (σ) : 5009.1(239.5)CU
- Uniformity :  4.8%

Intensity - Average (σ):3991.1(393.8)CU
 - Uniformity :   9.9%

INP SINGLE CRYSTAL WAFER AND METHOD FOR PRODUCING INP SINGLE CRYSTAL

TECHNICAL FIELD

The present invention relates to a method for producing a compound semiconductor single crystal and a compound semiconductor single crystal wafer, and more particularly to a technology of reducing a dislocation density of an InP single crystal produced by a liquid-encapsulated Czochralski method.

BACKGROUND ART

Conventionally, for producing a compound semiconductor single crystal such as InP, a liquid-encapsulated Czochralski method (LEC method) or a vertical gradient freezing method (VGF method) has generally been used.

The LEC method is a method for encapsulating a raw material melt contained in a crucible by a liquid encapsulant such as $B_2O_3$, and growing a crystal while raising a seed crystal dipped in a raw material melt surface. Evaporation of a volatile element from the raw material melt or the grown crystal can be suppressed by the liquid encapsulant. When a semiconductor material contains a volatile element (e.g., V-group element), by growing a crystal while controlling vapor pressure of the volatile element, it is possible to prevent dissociation of the volatile element from the raw material melt or a surface of the grown crystal (vapor pressure control method). Accordingly, by using the LEC method, it is possible to produce a large-diameter and highly pure compound semiconductor single crystal. For example, a general LEC method is disclosed in Patent Document 1.

In Nonpatent Documents 1 and 2, techniques of producing large-diameter (3 inches, 4 inches) and low dislocation density InP single crystals by using the LEC method are disclosed. Importance of a shape of a solid-liquid interface of a raw material melt and a temperature gradient in a crystal growth direction is described.

The VGF method is for arranging a seed crystal in a crucible bottom, encapsulating a raw material melt contained in the crucible by an liquid encapsulant such as $B_2O_3$, and gradually cooling the raw material melt from the lower side while applying high pressure by an inactive gas to grow a crystal upward from the seed crystal. Because the temperature gradient in the crystal growth direction is small, it is possible to grow a low dislocation density compound semiconductor single crystal.

For example, a general VGF method is disclosed in Patent Document 2. According to the Patent Document 2, by growing a crystal with a growth speed in a crystal increased diameter part set to 20 mm/hr or more to effectively prevent generation of twin in the crystal increased diameter part, it is possible to obtain a compound semiconductor single crystal with high yield. Moreover, in Nonpatent Document 3, a technique of producing an InP single crystal by using a VGF method is disclosed.

Patent Document 1: WO03/060202
Patent Document 2: JP A 11-302094
Nonpatent Document 1: Jpn. J. Appl. Phys. Vol. 41 (2002) pp. 987 to 990
Nonpatent Document 2: Proc. of 14th intern. Conf. on Indium Phosphide and Related Materials p. 397 to 400
Nonpatent Document 3: Proc. of 14th Intern. Conf. on Indium Phosphide and Related Materials p. 413 to 415

DISCLOSURE OF THE INVENTION

Problems to be Solved by the Invention

In use of an optical device such as a semiconductor laser, dislocation adversely affects various characteristics of the semiconductor laser, and causes great reduction in life. Thus, there is a demand for a compound semiconductor single crystal having a low dislocation density, preferably no dislocation (EPD≤500/cm$^2$).

However, according to the LEC method, a dislocation density (EPD) of the crystal tends to become high because the temperature gradient in the crystal growth direction is relatively large (e.g., 65° C./cm) when the crystal is grown. The dislocation density of the crystal is affected by a dopant to be added. For example, when S is a dopant, a single crystal having no dislocation is relatively easily obtained because S has an effect of canceling dislocation. However, when no dopant is present (undoped) or a dopant is Fe, it is difficult to obtain a single crystal having no dislocation because there is no such effect.

The VGF method is effective for reducing a dislocation density of the crystal because the temperature gradient in the crystal growth direction is relatively small (e.g., 1 to 10° C./cm) when the crystal is grown. However, there are problems of a low growth speed and low productivity as compared with the LEC method. Further, in the compound semiconductor single crystal grown by the VGF method, a dislocation density is low uniformly as a whole. However, areas where dislocation densities become 0/cm$^2$ are limited because stress is applied to the grown crystal from the crucible.

A substrate has recently been required of a large diameter (e.g., 3, 4 inches). In such a large-diameter compound semiconductor single crystal, however, a reduction in dislocation density is extremely difficult and it is not practically possible to obtain a non-dislocation area.

It is an object of the present invention to provide a method for producing a low-dislocation InP single crystal suitably used for an optical disk such as a semiconductor laser, and a low-dislocation InP single crystal wafer.

Means for Solving the Problem

The present invention has been developed to solve the foregoing problem. In a liquid-encapsulated Czochralski method in which a semiconductor raw material and an encapsulant are contained in a raw material melt containing part comprising a cylindrical crucible having a bottom, the raw material containing part is heated to melt the raw material, and a seed crystal is brought into contact with a surface of a melt of the raw material in a state of being covered with the encapsulant to grow a crystal while the seed crystal is raised; a crystal shoulder part is grown from the seed crystal by setting a temperature gradient in a crystal growth direction to 25° C./cm or less and setting a temperature-fall amount to 0.25° C./hr or more.

In an InP single crystal wafer cut out from an InP single crystal obtained by the above producing method, an area having a dislocation density of 500/cm$^2$ or less (i.e., non-dislocation area) is 70% or more of a wafer area. An area having a dislocation density of 200/cm$^2$ or less can be 60% or more of the wafer area, and an area having a dislocation density of 0/cm$^2$ can be 50% or more of the wafer area.

In an Fe doped or undoped InP single crystal wafer, it has not been realized that an area having a dislocation density of 0/cm$^2$ is 50% or more of a wafer area. It can be realized for the first time by the InP single crystal producing method of the present invention.

Description will be made of how the present invention has been developed.

The inventors produced an InP single crystal of a low dislocation density having a non-dislocation area of 70% or more of a wafer area by using a LEC method (vapor pressure control method) higher in productivity than a VGF method. Then, because it is effective to reduce a temperature gradient in a crystal growth direction in order to produce the InP single crystal of a low dislocation density, the inventors studied on how to reduce the temperature gradient as much as possible.

First, by using the LEC method, an Fe doped InP single crystal was grown under conventional growth conditions, i.e., a temperature gradient in a crystal growth direction set to 65° C./cm. There was not non-dislocation area at all in an InP single crystal wafer cut out from the obtained InP single crystal, and an average dislocation density was 2×10$^4$/cm$^2$. Then, the temperature gradient in the crystal growth direction was reduced from 65° C./cm to grow an Fe doped InP single crystal. Effectiveness of a reduction in temperature gradient, i.e., a dislocation density was lowered as the temperature gradient was reduced, was confirmed. However, when the temperature gradient in the crystal growth direction was excessively reduced, twin was generated in a crystal shoulder part and an InP single crystal was not obtained. This may be attributed to the fact that as crystal remelting easily occurs due to temperature fluctuation when the temperature gradient in the crystal growth direction is small, twin is easily formed.

To prevent crystal remelting which causes twin, it is effective to increase a temperature-fall amount during crystal growth (during crystal shoulder part formation). Accordingly, the inventors tried to grow the InP single crystal by increasing the temperature-fall amount of the crystal growth time until twin was no longer formed. Specifically, a temperature-fall amount conventionally set to 0.16° C./hr was increased more to prevent generation of twin.

As described above, an experiment was repeatedly conducted so that the temperature gradient in the crystal growth direction was reduced, the temperature-fall amount was increased to prevent generation of twin thereby growing the InP single crystal, and the dislocation density of the InP single crystal wafer cut out from the InP single crystal was reduced to a target value. When the temperature gradient in the crystal growth direction was set to 25° C./cm or less, and the temperature-fall amount was set to 0.25° C./hr or more, a non-dislocation area in the InP single crystal wafer was 70% or more.

Thus, it was discovered that the temperature gradient in the crystal growth direction must be set to 25° C./cm or less to grow the InP single crystal having a non-dislocation area of 70% or more, and the temperature-fall amount must be set to 0.25° C./hr or more to prevent generation of twin in the crystal shoulder part when the temperature gradient was 25° C./cm or less. This is how the present invention was completed.

Effects of the Invention

According to the present invention, in the Fe doped or undoped 3-inch or 4-inch large-diameter InP single crystal wafer, an area having a dislocation density of 500/cm$^2$ or less can be 70% or more, and the InP single crystal wafer is effective for improving characteristics of an optical device such as a semiconductor laser and prolonging a life.

Figure 1:
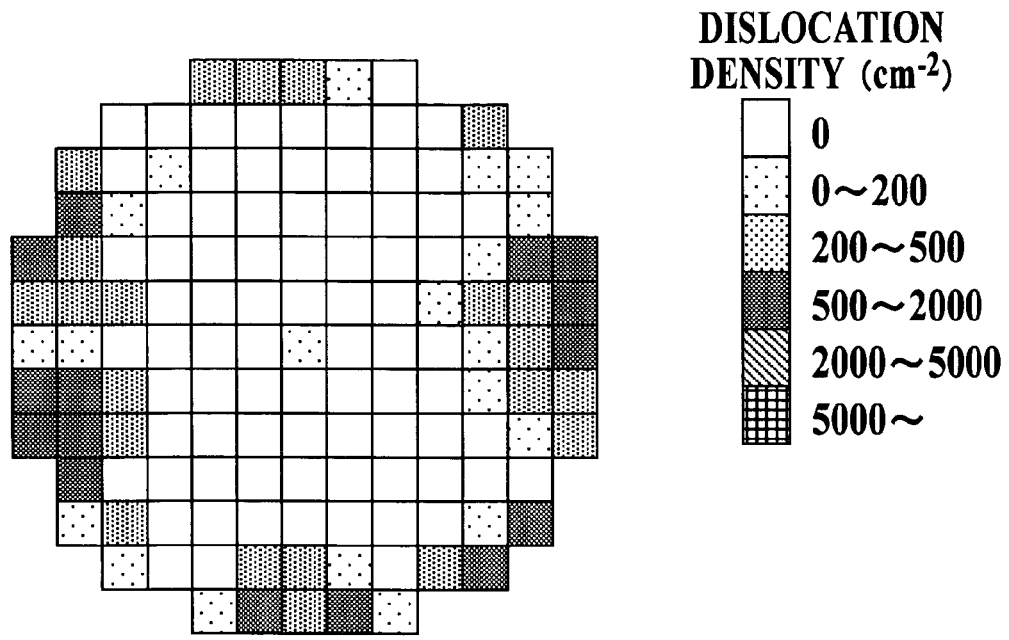
FIG. 1 This is an EPD map showing an EPD distribution on a full wafer surface cut out from a seed side of an InP single crystal obtained according to an Example.

EXPLANATION OF REFERENCE 1 outer container
2 inner container
3, 4, 5 heater
6 volatile element material
7 rotation lifting shaft
8 rotary shaft
9 seed crystal
10 suceptor
11 raw material melt (semiconductor material)
12 liquid encapsulant (e.g. B$_2$O$_3$)
13 pBN crucible

BEST MODE FOR CARRYING OUT THE INVENTION

The preferred embodiments of the present invention will be described below with reference to the accompanying drawings.

Figure 5:
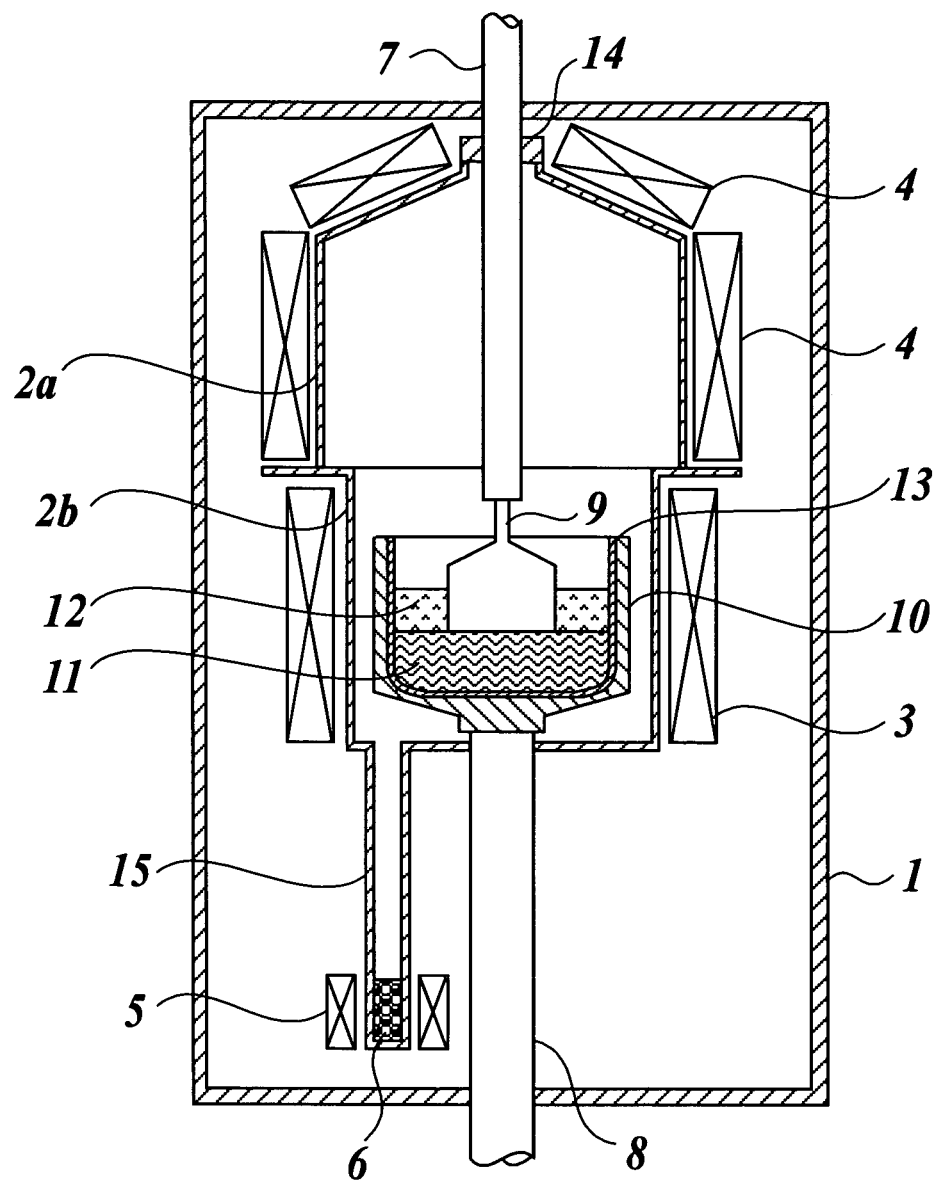
FIG. 5 This is a schematic configuration diagram showing a crystal growth device according to an Example.

FIG. 5 is a schematic configuration diagram showing a crystal growth device according to an embodiment. The crystal growth device of the embodiment includes an outer container 1 constituted of a cylindrical high pressure container having both ends closed, an inner container 2 constituted of a roughly cylindrical sealed container disposed to be divided up and down in the outer container 1, heaters 3, 4 and 5, a rotary shaft 8 vertically arranged in a center of the outer container 1, a suceptor 10 arranged in an upper end of the rotary shaft 8, a bottomed cylindrical pBN crucible 13 fitted to the suceptor 10 and capable of containing a raw material melt (semiconductor material) 11 and a liquid encapsulant (e.g., B$_2$O$_3$) 12, and a rotation lifting shaft 7 vertically disposed above the crucible 13 and equipped with a seed crystal holder (not shown) in the lower end thereof to fix a seed crystal 9.

The inner container 2 is constructed by joining an inner container upper part 2a and an inner container lower part 2b together by rubbing. The inner container upper part 2a is constituted of a quartz bell jar (heat insulating vacuum container), and the wire heater 4 is arranged in the outer periphery thereof. The inner container lower part 2b is made of, e.g., a material to be used under a high temperature, and the wall surface thereof is covered with an SiC film. In an outer periphery of the inner container lower part 2b, the heater 3 is arranged to surround the outer periphery of the inner container lower part 2b.

The rotary shaft 8 and the rotation lifting shaft 7 are introduced to be coaxial from inlets disposed in upper and bottom surfaces of the outer container 1, and disposed to elevate and rotate. The rotation lifting shaft 7 and the inner container upper part 2a are tightly sealed by a seal adaptor 14 into which the rotation lifting shaft 7 is inserted by rubbing. For example, when a temperature becomes sufficiently high in the outer container by heating of the heaters 3 and 4, by inserting the rotation lifting shaft 7 into the seal adaptor 14 to seal the rotation lifting shaft 7, the inner container 2 can be set in a sealed state.

For example, an Mo reservoir 15 that communicates with the inner container lower part 2b is mounted to a bottom of the inner container lower part 2b. This reservoir 15 receives, e.g., a volatile element material 6 made of a V-group element. The reservoir heater 5 is arranged in an outer periphery of the reservoir 15 which has contained the volatile material 6. The reservoir 15 is heated by the reservoir heater 5 to evaporate the volatile element material 6, and the inner container 2 is filled with vapor of the volatile element material 6. Therefore, vapor pressure in the inner container 2 can be controlled.

Example 1

A method for producing an Fe doped InP single crystal by using the foregoing crystal growth device according to the present invention will be described.

First, 4000 g of an InP polycrystal combined by horizontal Bridgman method (HB method), and 1 g of Fe as a dopant were contained in the crucible 13. 700 g of liquid encapsulant 12 made of $B_2O_3$ was applied thereon. Then, this crucible 13 was mounted on the suceptor 10 disposed in the inner end of the lower shaft 7. About 20 g of P of purity 99.9999% was contained in the reservoir 15.

Next, after the inner container upper part 2a was mounted on the inner container lower part 2b to be jointed together, the outer container 2 was sealed to evacuate the inside. Then, the inside was pressurized by an Ar gas, and heating of the inner container 2 was started by the heaters 3 and 4. The heating by the heaters 3 and 4 was accompanied by melting of the liquid encapsulant 12 of the crucible 13, and the raw material 11 was encapsulated by this liquid encapsulant 12. Subsequently, the temperature was increased more to melt the InP to obtain a raw material melt 11 of the liquid. At this point of time, the upper shaft 7 was lowered to be inserted into the seal adaptor 14, and the upper shaft 7 and the inner container upper part 2a were sealed.

Subsequently, heating by the reservoir heater 5 was started, and the volatile element material (P) was evaporated from the reservoir 15 to fill the inner container 2 with phosphor vapor. The upper shaft 7 and the lower shaft 8 were driven to enter the seed crystal arranged in the inner end of the upper shaft 7 into the raw material melt 11, and a crystal was lifted while relatively rotating the upper shaft 7 and the lower shaft 8.

At this time, by adjusting outputs of the heaters 3 and 4, a crystal shoulder part was grown with a temperature gradient in a crystal growth direction set to 20° C./cm and a temperature-fall set to 0.28° C./hr. By controlling the temperature gradient in the crystal growth direction and the temperature-fall amount, it was possible to grow a crystal shoulder part without generating any twin.

Then, a trunk part was grown with the temperature-fall amount set to 0 to 0.08° C./hr while the temperature gradient was kept at 20° C./cm to obtain an Fe doped InP single crystal of a 3-inch diameter and a 150 mm length.

Figure 2:
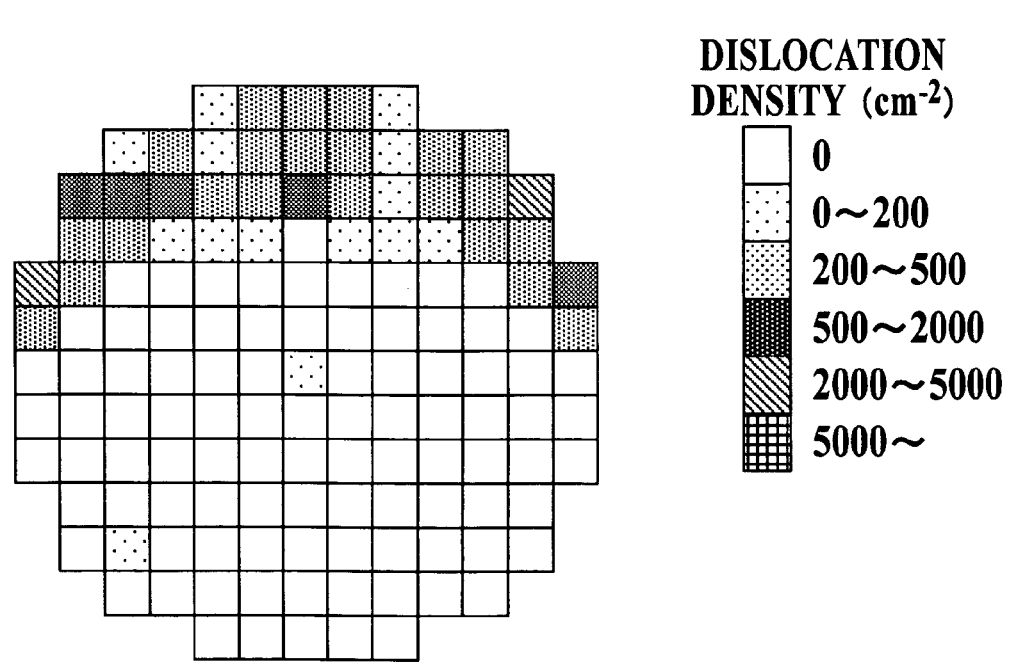
FIG. 2 This is an EPD map showing an EPD distribution of a full wafer surface cut out from the vicinity of a center of the InP single crystal obtained according to the Example.

Then, for an InP single crystal cut out from the vicinity of the center of the seed side of the obtained Fe doped InP single crystal, a dislocation density (EPD) was measured at 137 points to cover a full wafer surface. FIG. 1 is an EPD map showing an EPD distribution in a wafer cut out from the seed side of the trunk part, and FIG. 2 is an EPD map showing a wafer cut out from the vicinity of the center of the trunk part.

In FIG. 1, a non-dislocation area of EPD≤500/cm² was 89.0% (122/137), an area of EPD≤200/cm² was 73.0% (100/137), an area of EPD=0 was 58.4% (80/137), and an average EPD was 169/cm². In FIG. 2, a non-dislocation area of EPD≤500/cm² was 94.9% (130/137), an area of EPD≤200/cm² was 78.8% (108/137), an area of EPD=0 was 68.6% (94/137), an average EPD was 126/cm².

Thus, it can be said that the non-dislocation area was 70% or more in the wafer cut out from each part of the InP single crystal, and it was possible to realize a desired dislocation density in the entire Fe doped InP single crystal.

Figure 6:
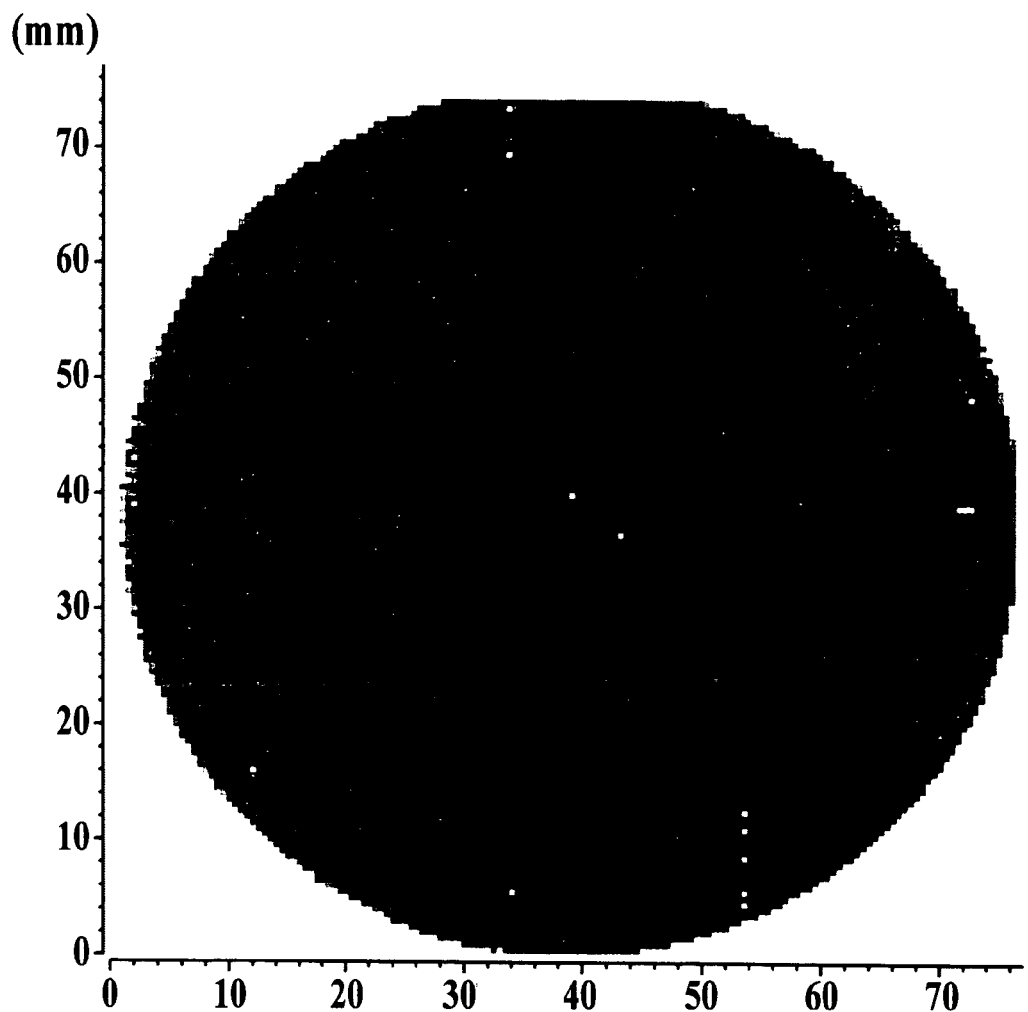
FIG. 6 This is a photoluminescence in-plane distribution diagram in a wafer cut out from the vicinity of a center of an InP single crystal obtained according to the Example.

Regarding a wafer cut out from the vicinity of the center of the InP single crystal obtained according to the Example, an in-plane distribution of photoluminescence (PL) was measured. FIG. 6 is a PL in-plane distribution obtained by PL measurement. As shown in FIG. 6, it was confirmed that average intensity of PL was almost uniform at about 5000 CU. A luminescent spot density was 10/cm².

Thus, according to the Example, as the crystal shoulder part was grown from the seed crystal to produce the InP single crystal with the temperature gradient in the crystal growth direction set to 20° C./cm and the temperature-fall amount set to 0.28° C./hr, the InP single crystal wafer in which the area having a dislocation density of 500/cm² or less (non-dislocation area) occupied 70% or more of the wafer area was realized. It can be understood that the area having a dislocation density of 200/cm² or less was 60% or more of the wafer area, and the area having a dislocation density of 0/cm² was 50% or more of the wafer area. Especially, in the Fe doped or undoped InP single crystal wafer, it had never been realized that the area having a dislocation density of 0/cm² was 50% or more of the wafer area.

Accordingly, by using the 3-inch diameter InP single crystal wafer in which the area having a dislocation density of 500/cm² or less occupies 70% or more of the wafer area for the optical device such as a semiconductor laser, it is possible to realize an optical disk excellent in various characteristics.

Comparative Example 1

As Comparative Example 1, by using a crystal growth device similar to that of the Example, a crystal shoulder part was grown with a temperature gradient of 30° C./cm and a temperature-fall amount of 0.25° C./hr, and a trunk part was grown by setting the temperature gradient to 65° C./cm and the temperature-fall amount to 0 to 0.08° C./hr, thereby obtaining an Fe doped InP single crystal.

Figure 3:
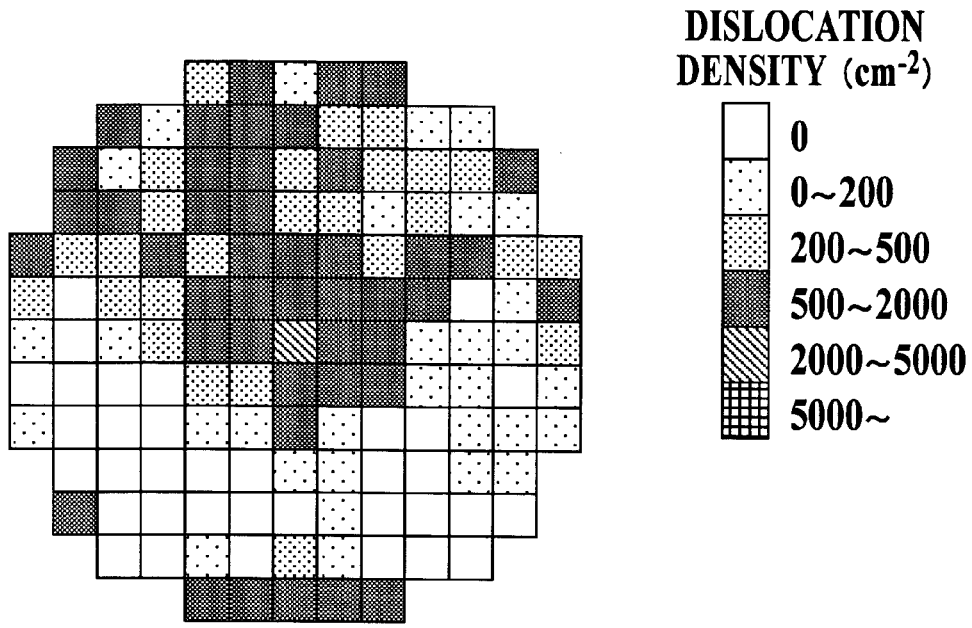
FIG. 3 This is an EPD map showing an EPD distribution on a full wafer surface cut out from the vicinity of a center of an InP single crystal obtained according to Comparative Example 1.

Regarding a wafer cut out from the vicinity of a center of the trunk part of the obtained Fe doped single crystal, FIG. 3 shows a result of measuring EPD at 137 points to cover the entire wafer surface.

In FIG. 3, a non-dislocation area of EPD≤500/cm² was 67.2% (92/137), an area of EPD≤200/cm² was 48.9% (67/137), an area of EPD=0 was 26.3% (36/137), and an average EPD was 362/cm².

Accordingly, by setting the temperature gradient smaller than that of the conventional case and increasing the temperature-fall amount to prevent generation of twin when a crystal shoulder part was grown, an InP single crystal wafer having a non-dislocation area was obtained. However, the dislocation density was clearly larger than that of the InP single crystal wafer obtained by the Example. Further, when an in-plane distribution of photoluminescence (PL) was measured regarding the obtained wafer, luminescent spots slightly increased, and the density thereof was 100 to 150/cm².

Comparative Example 2

As Comparative Example 2, by using a crystal growth device similar to that of the Example, an Fe doped InP single crystal was grown under conventional growth conditions. Specifically, a crystal shoulder part was grown with a temperature gradient of 65° C./cm and a temperature-fall amount of 0.16° C./hr, and a trunk part was grown by setting the temperature gradient to 65° C./cm and the temperature-fall amount to 0 to 0.08° C./hr.

Figure 4:
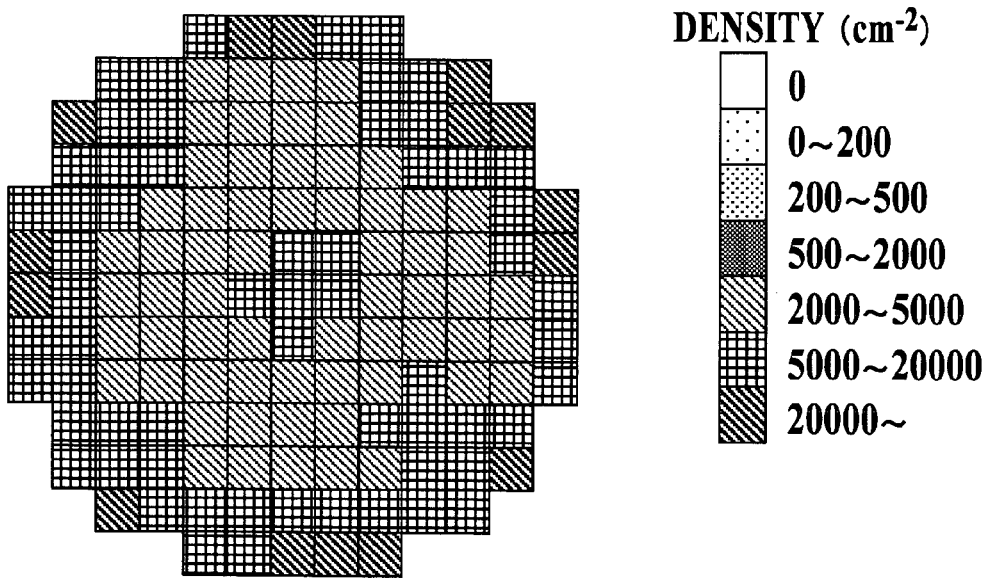
FIG. 4 This is an exemplary EPD map showing an EPD distribution on a full wafer surface cut out from the vicinity of a center of an InP single crystal obtained according to Comparative Example 2.

Regarding a wafer cut out from the vicinity of a center of the trunk part of the obtained Fe doped single crystal, FIG. 4 shows a result of measuring EPD at 137 points to cover the entire wafer surface.

In FIG. 4, there was no non-dislocation area of EPD≤500/cm², and an average EPD is 2×10⁴/cm².

Figure 7:
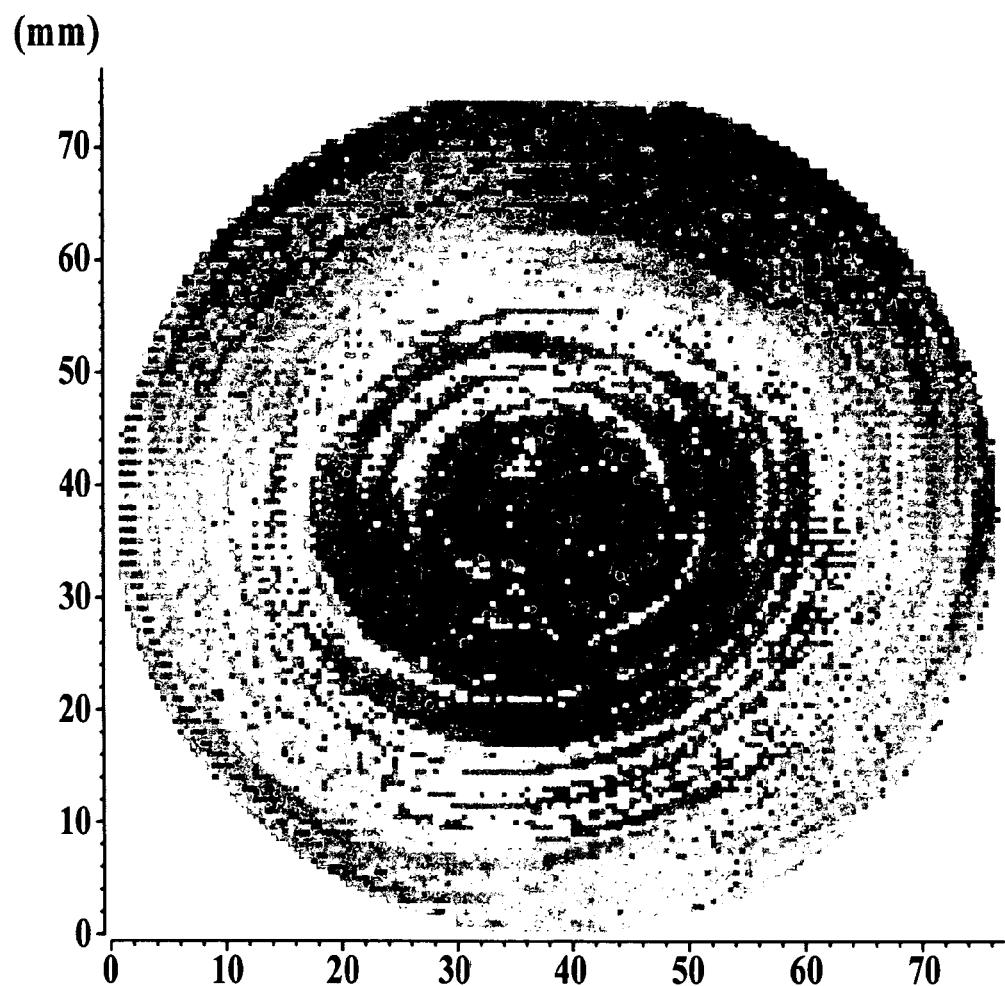
FIG. 7 This is a photoluminescence in-plane diagram in the wafer cut out from the vicinity of the center of the InP single crystal obtained according to the Comparative Example 2.

An in-plane distribution of photoluminescence (PL) was measured regarding the obtained wafer. FIG. 7 shows a PL in-plane distribution obtained by PL measurement. As shown in FIG. 7, average intensity was about 4000 CU, a concentric design called striation was observed, many luminescent spots were observed, and the density thereof was 300 to 1000/cm². The striation and the luminescent spots do not indicate dislocations themselves, but they are considered to be generated in connection with dislocations.

Comparative Example 3

As Comparative Example 3, by using a crystal growth device similar to that of the Example, an Fe doped InP single crystal was grown by setting a temperature gradient lower than that under the conventional growth conditions. Specifically, a crystal shoulder part was grown with a temperature gradient of 20° C./cm and a temperature-fall amount of 0.16° C./hr, and a trunk part was grown by setting the temperature gradient to 20° C./cm and the temperature-fall amount to 0 to 0.08° C./hr.

In this case, twin was generated in the crystal shoulder part, and an InP single crystal was not obtained.

The invention developed by the inventors has specifically been described based on the embodiments. However, the present invention is not limited to the embodiment, but various changes can be made without departing from the gist of the present invention.

For example, according to the embodiment, the crystal shoulder part is grown from the seed crystal with the temperature gradient in the crystal growth direction set to 20° C./cm and the temperature-fall amount set to 0.28° C./hr. However, by setting the temperature gradient in the crystal growth direction to 25° C./cm or less and the temperature-fall amount to 0.25° C./hr or more, it is possible to produce an InP single crystal of a low dislocation density without generating any twin. Moreover, in the obtained InP single crystal wafer, it is possible to limit a luminescent spot density by PL measurement to 100/cm² or less. Thus, through the PL measurement, it is possible to confirm that a dislocation is as low as a desired range without any destruction.

INDUSTRIAL APPLICABILITY

The present invention is not limited to the Fe doped InP single crystal but can be applied to producing of an undoped InP single crystal where dislocation is more difficult to occur than the Fe doped InP single crystal.

Furthermore, the invention is not limited to the 3-inch diameter InP single crystal but may possibly be applied to achievement of a low dislocation density of a 4-inch or larger bore InP single crystal.

The invention claimed is:

1. An InP single crystal wafer, comprising an area having a dislocation density of 200/cm² or less occupying 60% or more of the wafer,
    wherein the wafer is an iron-doped or undoped InP single crystal wafer, and
    wherein the iron-doped or undoped InP single crystal wafer is cut out from an iron-doped or undoped InP single crystal and has a diameter in the range of from 3 inches to 4 inches.

2. The InP single crystal wafer as claimed in claim 1, wherein an area having a dislocation density of 0/cm² occupies 50% or more of the wafer.

3. The InP single crystal wafer as claimed in claim 2, wherein the InP single crystal is grown by a liquid-encapsulated Czochralski method in which a semiconductor raw material and an encapsulant are contained in a raw material melt containing part comprising a cylindrical crucible having a bottom, the raw material containing part is heated to melt the raw material, and a seed crystal is brought into contact with a surface of a melt of the raw material in a state of being covered with the encapsulant to grow a crystal while the seed crystal is raised.

4. The InP single crystal wafer as claimed in claim 1, wherein the InP single crystal is grown by a liquid-encapsulated Czochralski method in which a semiconductor raw material and an encapsulant are contained in a raw material melt containing part comprising a cylindrical crucible having a bottom, the raw material containing part is heated to melt the raw material, and a seed crystal is brought into contact with a surface of a melt of the raw material in a state of being covered with the encapsulant to grow a crystal while the seed crystal is raised.

5. A method for producing the InP single crystal wafer of claim 1, comprising a liquid-encapsulated Czochralski method,
    wherein a semiconductor raw material and an encapsulant are contained in a raw material melt containing part comprising a cylindrical crucible having a bottom, the raw material containing part is heated to melt the raw material, and a seed crystal is brought into contact with a surface of a melt of the raw material in a state of being covered with the encapsulant to grow a crystal while the seed crystal is raised;
    a crystal shoulder part is grown from the seed crystal by setting a temperature gradient in a crystal growth direction to 25° C./cm or less and setting a temperature to fall at a rate of 0.25° C./hr or more, and
    wherein the crystal is an iron-doped or undoped InP single crystal, and wherein an InP single crystal wafer is cut out from the iron-doped or undoped InP single crystal and the InP single crystal wafer has a diameter in the range of from 3 inches to 4 inches.

6. The method for producing the InP single crystal wafer as claimed in claim 5, wherein the temperature gradient in a crystal growth direction is 20° C./cm and the temperature falls at a rate of 0.28° C./hr.

7. The method for producing the InP single crystal wafer of claim 5, wherein the temperature gradient in a crystal growth direction is 20° C./cm to 25° C./cm and the temperature falls at a rate of 0.25° C./hr to 0.28° C./hr.

8. An InP single crystal wafer which is an InP single crystal wafer cut out from the iron-doped or undoped InP single crystal produced by the method as claimed in claim 7.

9. The InP single crystal wafer according to claim 8, wherein an area having a dislocation density of $0/cm^2$ occupies 50% or more of the wafer.

* * * * *